(12) United States Patent
Kondoh (10) Patent No.: US 7,018,162 B2
(45) Date of Patent: Mar. 28, 2006

(54) ARTICULATED CARRYING DEVICE

(75) Inventor: Keisuke Kondoh, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/795,975

(22) Filed: Mar. 10, 2004

(65) Prior Publication Data

US 2004/0179930 A1    Sep. 16, 2004

(30) Foreign Application Priority Data

Mar. 10, 2003    (JP)    .............................. 2003-062777

(51) Int. Cl.
    *B66C 23/00*    (2006.01)
(52) U.S. Cl. ............................. 414/744.5; 74/490.05; 901/15
(58) Field of Classification Search ............ 414/744.5; 901/15; 74/490.01, 490.05, 490.08, 490.09
    See application file for complete search history.

(56) References Cited

U.S. PATENT DOCUMENTS

| | | | |
|---|---|---|---|
| 4,762,016 A | * | 8/1988 | Stoughton et al. ............ 74/479 |
| 5,789,890 A | * | 8/1998 | Genov et al. ................ 318/567 |
| 5,857,826 A | * | 1/1999 | Sato et al. ................ 414/744.6 |
| 6,540,471 B1 | * | 4/2003 | Brogardh .................... 414/729 |
| 6,655,901 B1 | * | 12/2003 | Tsubota et al. .......... 414/744.5 |

FOREIGN PATENT DOCUMENTS

| | | |
|---|---|---|
| JP | 62-106168 | 5/1987 |
| JP | 03-019252 | 1/1991 |
| JP | 04-129685 | 4/1992 |
| JP | 06-338554 | 12/2004 |

* cited by examiner

*Primary Examiner*—Donald W. Underwood
(74) *Attorney, Agent, or Firm*—Smith, Gambrell & Russell LLP (57) ABSTRACT

A carrying device carries a semiconductor wafer above a base disposed in a transfer chamber or the like. The carrying device comprises pick for holding the object, a main arm mechanism adapted to bend and stretch in a horizontal operating plane, and an auxiliary arm mechanism adapted to bend and stretch in a vertical operating plane. The main arm mechanism includes a proximal end supported by the base, and distal end connected to the pick, respectively. The auxiliary arm mechanism includes a main arm and an arm linkage. The main arm has a proximal end supported by the base, and distal end. The arm linkage has a proximal end connected to the distal end of the main arm and a distal end connected to the pick.

9 Claims, 11 Drawing Sheets

ARTICULATED CARRYING DEVICE

BACKGROUND OF THE INVENTION

1. Field of the Invention

The present invention relates to an articulated carrying device for carrying an object to be processed, such as a semiconductor wafer.

2. Description of the Related Art

Generally, a wafer is subjected various processes including a film forming process, an etching process, an oxidation process and a diffusion process to fabricate a semiconductor integrated circuit device. To deal with the decrease of device dimensions and the increase of device scale of semiconductor integrated circuit devices, a clustered processing system has been proposed to improve throughput and yield. The clustered processing system has one transfer chamber, and a plurality of processing devices that carries out the same process or processing chambers in which different processes are carried out connected to the transfer chamber. The clustered processing system is capable of transferring a wafer from one processing chamber to another without exposing the wafer to the atmosphere to subject the wafer continuously to the processes.

In processing wafers by the processing system of this type, a carrying device takes out a wafer from a wafer cassette placed at a wafer receiving port installed at the front end of the processing system and carries the wafer into an entrance transfer chamber. Then, an orienting device orients the wafer and the carrying device carries the wafer into a vacuum load-lock chamber capable of being evacuated. Another carrying device carries the wafer from the vacuum load-lock chamber into a vacuum transfer chamber surrounded by and connected to processing chambers and carries the wafer into the processing chambers successive to subject the wafer continuously to processes. The wafer thus processed is reversed and is returned to the wafer cassette.

The processing system of this type is provided internally with one or a plurality of carrying devices, and the wafer is transferred and carried automatically by the carrying device or the carrying devices.

The carrying device has, for example, an articulated arm capable of moving in horizontal directions, of bending and stretching, of turning and of moving vertically, and a pick connected to the distal end of the articulated arm. The articulated arm moves a pick directly holding the wafer horizontally to carry the wafer to a desired position.

The following are prior art carrying devices of the type mentioned above.

A carrying device disclosed in JP 3-19252 A/1991 (document 1) includes a pivot arm connected to a rotating shaft to convert a rotating motion into a linear motion and capable of linearly moving along a slide rail, and a pick connected to the distal end of the pivot arm and capable of holding and carrying a semiconductor wafer.

A carrying device disclosed in JP 4-129685 A/1992 (document 2) includes two articulated arms supported for turning, and combined in a frog leg mechanism so as to move in opposite directions, respectively, and pick connected to the respective distal ends of the articulated arms to carry two wafers simultaneously.

A carrying device disclosed in JP 6-338554 A/1994 (document 3) includes two rotating shafts respectively having different axes and disposed side by side, two articulated arms respectively supported on the rotating shafts, and picks respectively connected to the distal ends of the articulated arms. The picks are connected to the articulated arms at different levels, respectively, to avoid interference between the picks.

A carrying device disclosed in JP 62-106168 A/1987 (document 4) includes a linear-motion robot mechanism including a 3-dimentional linkage formed by combining two 2-dimentional linkages to exclude linearly sliding shafts that often produce particles.

Each of the carrying devices disclosed in the documents 1 to 3 has long linearly sliding parts, and/or needs a gear mechanism or timing belts to transmit driving force to the arm mechanism. Those component parts are liable to produce particles (dust) detrimental to semiconductor wafers.

Particularly, the meshed gears of the gear mechanism generate vibrations that dislocate the wafer. The timing belts are often damaged or broken.

Those problems do not arise in the carrying device disclosed in the document 4. However, since this carrying device has the 3-dimentional linkage formed by combining, for example, a 2-dimentional linkage that operates in a horizontal plane and a 2-dimentional linkage that operates in a vertical plane, the carrying device is large, needs a very large space for operation, and hence is difficult for application to a semiconductor device fabricating system.

SUMMARY OF THE INVENTION

The present invention has been made in view of the foregoing problems and it is therefore an object of the present invention to provide a small articulated carrying device that needs a small space for operation, produces little particles, and carries an object to be processed in a high positioning accuracy.

Thus, according to the present invention, there is provided a carrying device for carrying an object to be processed above a base, the carrying device comprising:

(a) a pick for holding the object;

(b) a main arm mechanism having a proximal end supported by the base and a distal end connected to the pick, and adapted to bend and stretch in a first operating plane; and (c) an auxiliary arm mechanism including:

(c1) a base arm having a proximal end supported by the base, and a distal end, and (c2) an arm linkage having a proximal end connected to the distal end of the main arm and a distal end connected to the pick, and adapted to bend and stretch in a second operating plane intersecting the first operating plane.

In this carrying device, the main arm mechanism and the auxiliary arm mechanism operate in the mutually intersecting operating planes, respectively, and the auxiliary arm mechanism is formed in a compact mechanism including the base arm and the arm linkage. Therefore, the carrying device is small, needs a small space for operation, produces little particles and carries the object in a high positioning accuracy.

Preferably, the carrying device further comprises first and second drive shafts coaxially supported by the base for individual rotation, and the proximal end of the main arm mechanism and the proximal end of the main arm are connected to the first and second drive shafts, respectively.

Even if, for example, the main arm mechanism and the auxiliary arm mechanism are disposed in a vacuum transfer chamber, and a rotative drive mechanism for driving the first and second drive shaft is disposed outside the vacuum transfer chamber, the rotative drive mechanism can be electromagnetically coupled with the first and second drive shaft through a wall defining the vacuum transfer chamber. Thus, the vacuum transfer chamber can be surely hermetically sealed, and particles produced by the rotative drive mechanism can be prevented from entering the transfer chamber.

In the carrying device, the first operating plane in which the main arm mechanism operates may be a horizontal plane, and the second operating plane in which the auxiliary arm mechanism operates may be a vertical plane.

When the main arm mechanism and the auxiliary arm mechanism operate in the horizontal and the vertical plane, respectively, it is preferable that a joint between the base arm and the arm linkage of the auxiliary arm mechanism is at a level lower than that of a joint between the arm linkage and the pick.

Since the joints in the auxiliary arm mechanism are at the different levels, respectively, the auxiliary arm mechanism does not have any dead point where arms of the arm linkage overlap each other, so that the pick is prevented from shaking.

In the carrying device, it is preferable that the arm linkage of the auxiliary arm mechanism is bendable in a V-shape in the vertical plane.

When the stretched arm linkage is bent greatly, the pick moves in a direction in which the arm linkage is pressed by its own weight and, consequently, the pick moving operation can be smoothly started.

According to the present invention, there is also provided a second carrying device for carrying an object to be processed above a base, the carrying device comprising:
  (a) first and second picks each for holding the object;
  (b) a main arm mechanism adapted to bend and stretch in a first operating plane, and including:
    (b1) a main arm having a proximal end supported by the base and a distal end,
    (b2) a first arm having a proximal end connected to the distal end of the main arm and a distal end connected to the first pick, and
    (b3) a second arm having a proximal end connected to the distal end of the main arm and a distal end connected to the second pick; and
  (c) an auxiliary arm mechanism including:
    (c1) a base arm having a proximal part supported by the base and first and second distal ends,
    (c2) a first arm linkage having a proximal end connected to the first distal end of the base arm and a distal end connected to the first pick, and adapted to bend and stretch in a second operating plane intersecting the first operating plane, and
    (c3) a second arm linkage having a proximal end connected to the second distal end of the base arm and a distal end connected to the second pick, and adapted to bend and stretch in a third operating plane intersecting the first operating plane.

The second carrying device having the two pick is small, needs a small space for operation, produces little particles and carries the object in a high positioning accuracy.

In the second carrying device, the base arm may be configured to form a straight angle between a first extending direction from the proximal part toward the first distal end of the base arm, and a second extending direction from the proximal part toward the second distal end of the base arm, and the first and second picks may be moved in parallel to the first and second extending directions, respectively.

Since objects held by the first and second picks are moved in opposite directions, the objects will not interfere with each other even if the objects are large.

In the second carrying device, the main arm may have a first distal end connected to the proximal end of the first arm and a second distal end connected to the proximal end of the second arm, the first and second distal ends being spaced from each other, the base arm may be configured to form an angle below 180° between a first extending direction from the proximal part toward the first distal end of the base arm, and a second extending direction from the proximal part toward the second distal end of the base arm, and the first and second picks may be moved in parallel to the first and second extending directions, respectively.

Since objects held by the first and second picks are moved in the first and second directions forming the angle less than 180°, for example 60° or 90°, respectively, throughput when objects are carried alternately by the first and second picks to the same desired position is higher than that when objects are carried in opposite directions.

In the second carrying device, the first operating plane in which the main arm mechanism operates may be a horizontal plane, and the second and third operating planes in which the auxiliary arm mechanism operates may be a vertical plane.

According to the present invention, there is also provided a third carrying device for carrying an object to be processed above a base, the carrying device comprising;
  (a) a pick for holding the object;
  (b) a main arm mechanism adapted to bend and stretch in a first operating plane, and including:
    (b1) a proximal main arm having a proximal end supported by the base, and a distal end,
    (b2) a distal main arm having a proximal end and a distal end connected to the pick, and
    (b3) one or more intermediate main arms each having a proximal end and a distal end connected to the distal end and the proximal end of the adjacent main arms, respectively; and
  (c) an auxiliary arm mechanism adapted to bend and stretch in a second operating plane intersecting the first operating plane, and including:
    (c1) an proximal auxiliary arm having a proximal end supported by the base, and a distal end,
    (c2) an distal auxiliary arm having a proximal end and a distal end connected to the pick, and
    (c3) intermediate auxiliary arms twice as many as the intermediate main arms, each having a distal end and a proximal end, one of the distal and proximal ends being connected to the end of the adjacent auxiliary arm, and the other one of the proximal and distal ends being connected to the end of the adjacent auxiliary arm and supported for rotation by the intermediate main arm.

The third carrying device is small, needs a small space for operation, produces little particles and carries the object in a high positioning accuracy.

Preferably, the third carrying device further comprises one or more connecting members through which the adjacent intermediate auxiliary arms are connected to each other, the connecting members being attached to the respective intermediate main arms.

In the third carrying device, the first operating plane in which the main arm mechanism operates may be a horizontal plane, and the second operating plane in which the auxiliary arm mechanism operates may be a vertical plane.

DESCRIPTION OF THE PREFERRED EMBODIMENTS

Carrying devices in preferred embodiments according to the present invention will be described with reference to the accompanying drawings.

First Embodiment

Figure 1:
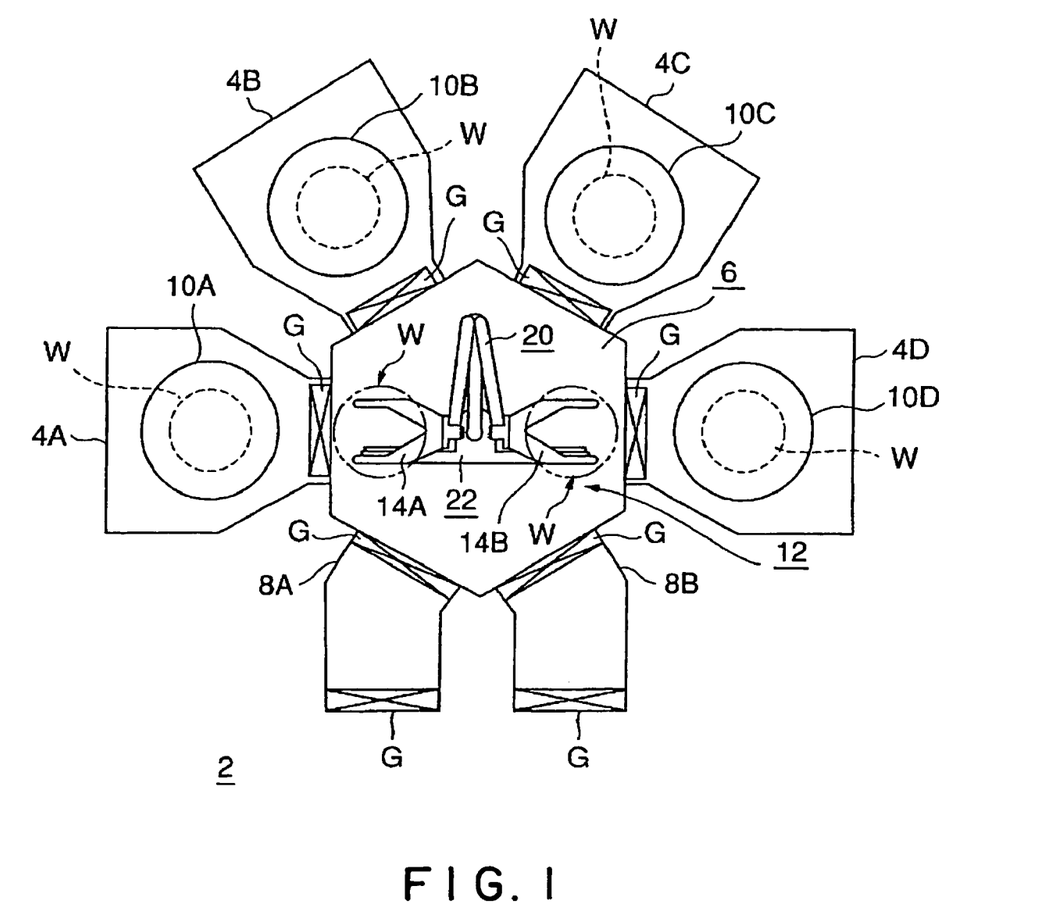
FIG. 1 is schematic plan view of a processing system provided with a carrying device in a first embodiment according to the present invention.

Referring to FIG. 1, a processing system 2 with a carrying device in a first embodiment according to the present invention will be described.

The processing system 2 has, for example, four processing vessels respectively defining processing chambers 4A, 4B, 4C and 4D, a substantially hexagonal vacuum transfer vessel defining a transfer chamber 6 capable of being evacuated, a first load-lock vessel defining a first vacuum load-lock chamber 8A, and a second load-lock vessel defining a second vacuum load-lock chamber 8B. Each of the load-lock chambers 8A and 8B is connected to another transfer chamber, not shown.

The processing chambers 4A to 4D are connected to the four sides of the substantially hexagonal transfer chamber 6, respectively, and the load-lock chambers 8A and 8B are connected to the other two sides of the transfer chamber 6, respectively.

Gate valves G capable of hermetic sealing are disposed at the joints of the transfer chamber 6 and the four processing chambers 4A to 4D, and the joints of the transfer chamber 6 and the load-lock chambers 8A and 8B. Thus, the processing system is a clustered processing tool. The processing chambers 4A to 4D and the load-lock chambers 8A and 8B are able to communicate with the transfer chamber 6 by means of the gate valves G when necessary. Gate valves G close the entrances of the load-lock chambers 8A and 8B hermetically, respectively.

Susceptors 10A to 10D for supporting a semiconductor wafer, i.e., an object to be processed, is disposed in the four processing chambers 4A to 4D. Semiconductor wafers are subjected to different processes, respectively, or to the same process in the processing chambers 4A to 4D. A carrying device 12 in a first embodiment according to the present invention is disposed in the transfer chamber 6. The carrying device 12 is adapted to bend and stretch, of turning and of gaining access to an object to be processed placed in the processing chambers 4A to 4D and the load-lock chambers 8A and 8B. The carrying device 12 has two picks 14A and 14B to handle two wafers simultaneously. The carrying device 12 may have a single pick.

The carrying device 12 will be described with reference to FIG. 2 to 5.

Figure 2:
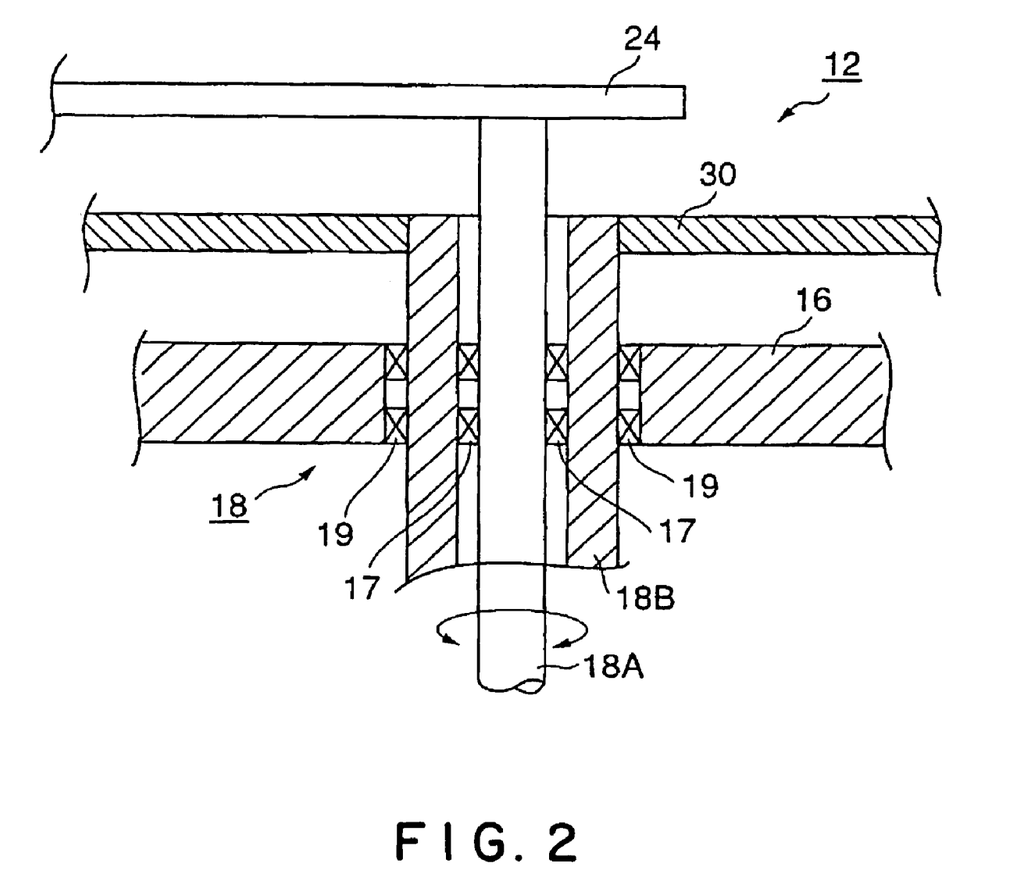
FIG. 2 is a schematic sectional view of a bearing mechanism for the carrying device in the first embodiment.

Referring to FIG. 2, the carrying device 12 is mounted on a rotary support mechanism 18 including a hollow outer shaft (second drive shaft) 18B and an inner shaft (first drive shaft) 18A extended coaxially through the outer shaft 18B. The outer shaft 18B is supported in bearings 19 for rotation on a base 16 serving as the bottom wall of the transfer chamber 6. The inner shaft 18A is supported for rotation relative to the outer shaft 18B in bearings 17 on the outer shaft 18B. The inner shaft 18A and the outer shaft 18B are driven by stepping motors or the like, respectively.

Figure 3:
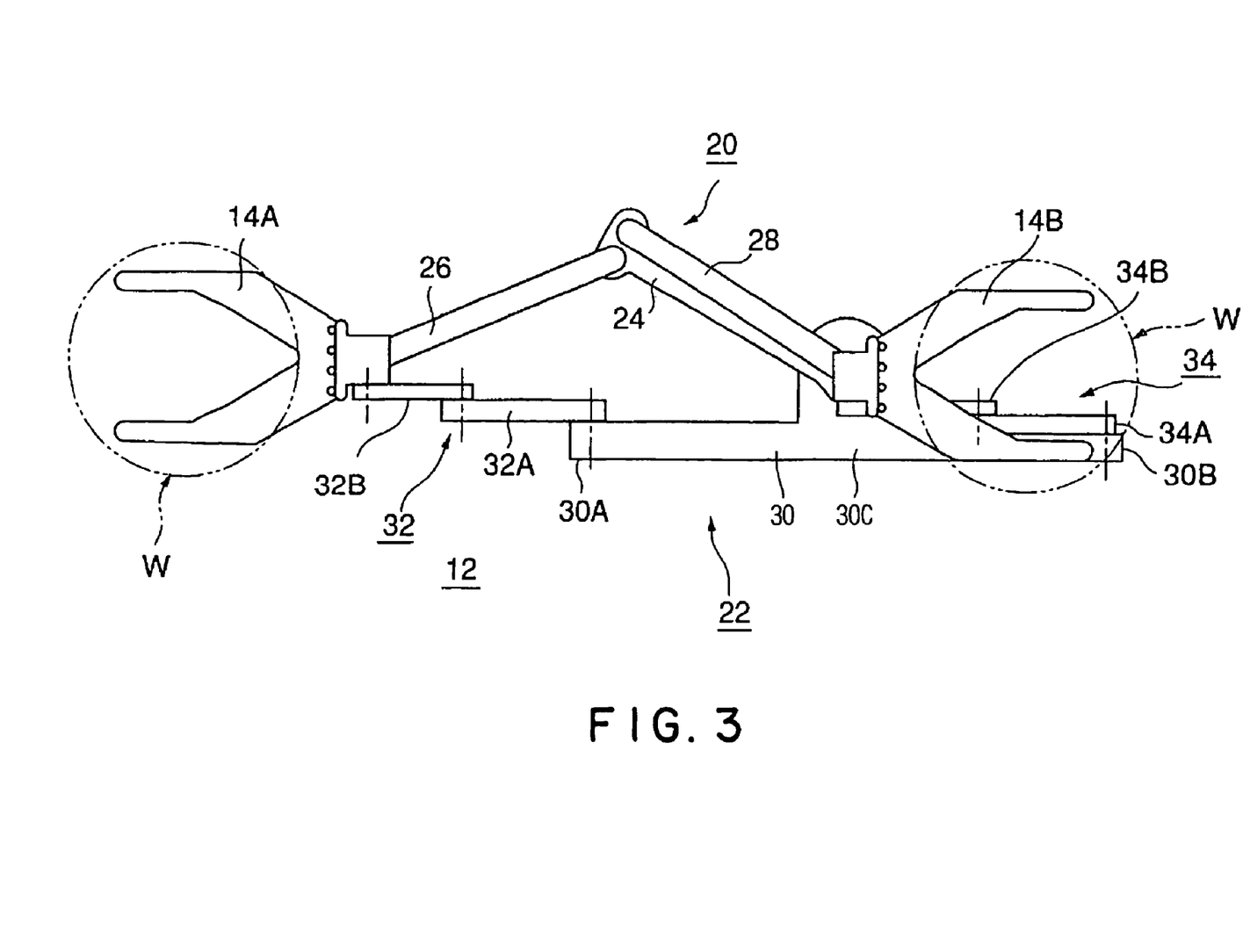
FIG. 3 is a plan view of a carrying device in the first embodiment.
Figure 4:
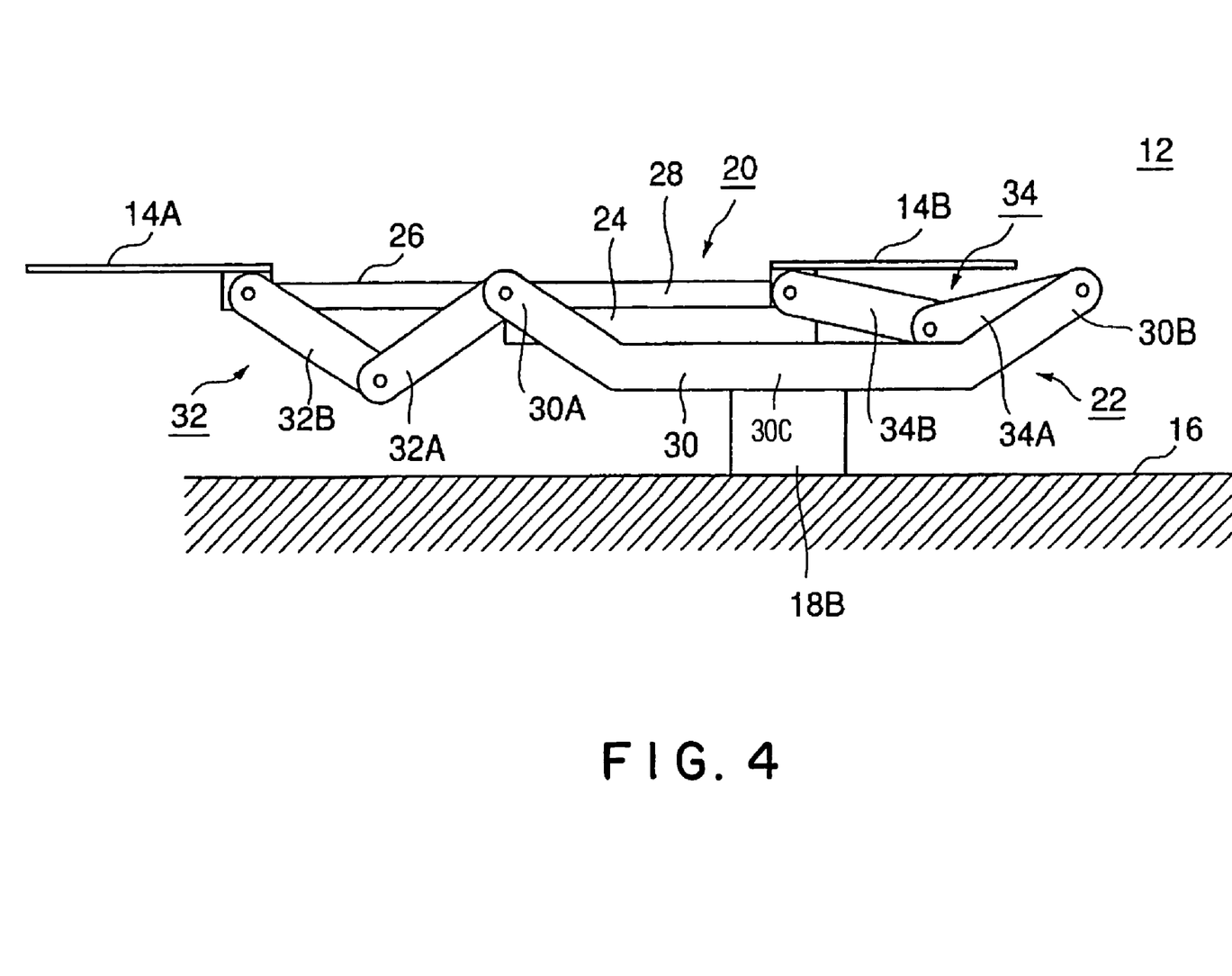
FIG. 4 is a side elevation of the carrying device in the first embodiment.

The carrying device 12 has a main arm mechanism 20 that operates in a horizontal operating plane, and an auxiliary arm mechanism 22 that operates in a vertical operating plane. The main arm mechanism 20 bends and stretches in a horizontal operating plane, and the auxiliary arm mechanism 22 bends and stretches in a vertical operating plane.

The main arm mechanism 20 includes a main arm 24 having a proximal end fixedly mounted on the inner shaft 18A, a first arm 26 having a proximal end pivotally connected to a distal end of the main arm 24, and a second arm 28 having a proximal end pivotally connected to the distal end of the main arm 24. The first and second arms 26 and 28 are able to turn on the distal end of the main arm 24 in the horizontal operating plane. The picks 14A and 14B have proximal ends pivotally connected to the distal ends of the first arm 26 and the second arm 28, respectively.

The auxiliary arm mechanism 22 includes a base arm 30 having a central proximal part 30C horizontally extending in opposite directions forming a straight angle toward a first distal end 30A and a second distal end 30B, and two bendable, stretchable arm linkages 32 and 34 respectively connecting the picks 14A and 14B to the distal ends 30A and 30B of the base arm 30. The central proximal part 30C of the base arm 30 is fixed to the outer shaft 18B at a position near the proximal end of the main arm 24 of the main arm mechanism 20. The first distal end 30A and the second distal end 30B of the base arm 30 are bent upward such that the first distal end 30A and the second distal end 30B will not interfere with the horizontally moving picks 14A and 14B. The distances between the first distal end 30A and the central proximal part 30C and between the second distal end 30B and the central proximal part 30C are approximately equal to the length of the main arm 24.

The arm linkage 32 includes a first auxiliary arm 32A, and a second auxiliary arm 32B pivotally connected to a distal end of the first auxiliary arm 32A. The respective lengths of the first auxiliary arm 32A and the second auxiliary arm 32B are slightly longer than half the length of the first arm 26. The first auxiliary arm 32A has a proximal end set on a side surface of the distal end 30A of the base arm 30 and pivotally connected to the distal end 30A for turning in a vertical plane. The second auxiliary arm 32B has a distal end set on a side surface of a proximal end of the pick 14A and pivotally connected to the proximal end of the pick 14A for turning in a vertical plane. The arm linkage 32 is bendable in a V-shape and stretchable in a vertical plane. Therefore, the arm linkage 32 of the auxiliary arm mechanism 22 is capable of moving the pick 14A radially relative to the center of the carrying device 12 and is incapable of moving the pick 14A in a circumferential direction (transverse direction). Connecting parts at the opposite ends of the arm linkage 32 are at substantially the same height.

The other arm linkage 34 includes a first auxiliary arm 34A, and a second auxiliary arm 34B pivotally connected to a distal end of the first auxiliary arm 34A. The respective lengths of the first auxiliary arm 34A and the second auxiliary arm 34B are slightly longer than half the length of the second arm 28. The first auxiliary arm 34A has a proximal end set on a side surface of the distal end 30B of the base arm 30 and pivotally connected to the distal end 30B for turning in a vertical plane. The second auxiliary arm 34B has a distal end set on a side surface of a proximal end of the pick 14B and pivotally connected to the proximal end of the pick 14B for turning in a vertical plane. The arm linkage 34 is bendable in an upward convex V-shape and stretchable in a vertical plane. Therefore, the arm linkage 34 of the auxiliary arm mechanism 22 is capable of moving the pick 14B radially relative to the center of the carrying device 12 and is incapable of moving the pick 14B in a circumferential direction (transverse direction). Connecting parts at the opposite ends of the arm linkage 34 are at substantially the same height.

The operation of the carrying device 12 in the first embodiment will be explained.

The inner shaft 18A and the outer shaft 18B are turned synchronously through the same angle to change the orientation of the whole carrying device 12.

Figure 5:
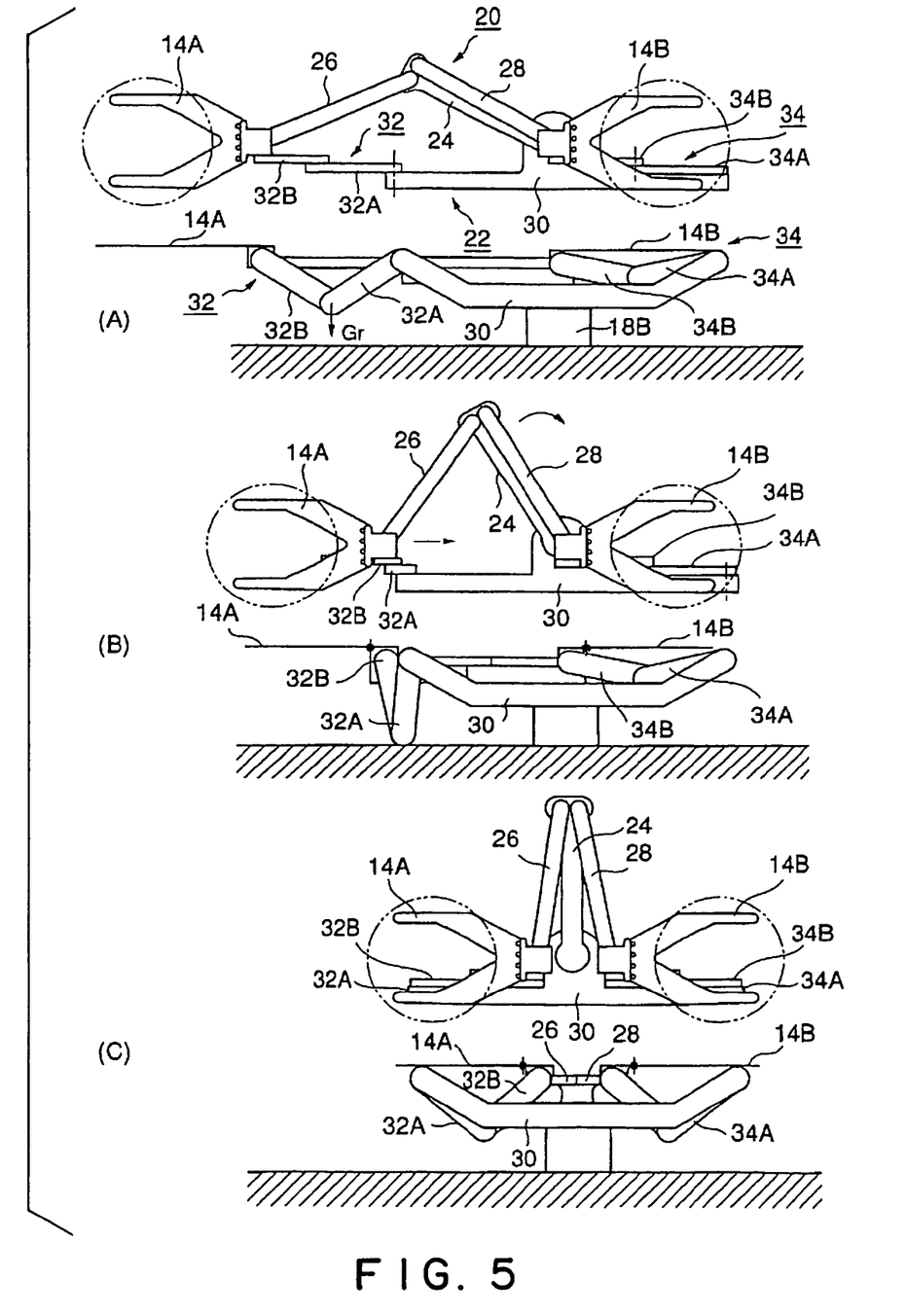
FIG. 5 is a view of assistance in explaining the construction and operation of the carrying device in the first embodiment.

Only the inner shaft 18A is turned in the forward and the reverse direction with the outer shaft 18B kept stationary to move the picks 14A and 14B of the carrying device 12 in radial directions. The picks 14A and 14B are moved symmetrically in opposite directions, respectively. When the pick 14A needs to be advanced as shown in FIG. 5(A), the outer shaft 18B is kept stationary to restrain the auxiliary arm mechanism 22 from turning in the horizontal operating plane and the inner shaft 18A is turned so as to turn the first arm 24 of the main arm mechanism 20 counterclockwise. When the inner shaft 18A is thus turned, the main arm mechanism 20 stretches to move the pick 14A radially, while the auxiliary arm mechanism 22 restrains the arm mechanism 20 from turning. The arm linkage 32 of the auxiliary arm mechanism 22 is fully stretched when the pick 14A is fully advanced to its forward limit position, and the other pick 14B is fully retracted to its backward limit position.

When the pick 14A needs to be retracted from its forward limit position as shown in FIGS. 5(B) and (C), the first arm 24 of the main arm mechanism 20 is turned clockwise. Consequently, the main arm mechanism 20 is folded gradually to retract the pick 14A toward the center of the carrying device 12. At the same time, the auxiliary arm mechanism 22 is folded.

Since the arm linkage 32 is bent in a downward convex V-shape at the start of retraction of the pick 14A, the weight Gr (FIG. 5(A)) of the arm linkage 32 assists the movement of the pick 14A toward the center of the carrying device 12, so that the pick 14A can smoothly start moving toward the center of the carrying device 12. Thus, the weight Gr of the arm linkage 32 acts always in a direction to fold the arm linkage 32 and hence the pick 14A can smoothly start moving backward from the forward limit position.

As shown in FIG. 5(C), the picks 14A and 14B are positioned at their backward limit positions nearest to and symmetrical with respect to the center of the carrying device 12 when the first arm 24 is extended substantially perpendicularly to the base arm 30 of the auxiliary arm mechanism 22. The carrying device 12 in a state shown in FIG. 5(C) is turned about the axis of the rotary support mechanism 18 to change the directions of movement of the picks 14A and 14B in the horizontal operating plane.

The other pick 14B moves similarly to the pick 14A when the first arm 24 of the main arm mechanism 20 is turned clockwise in opposite direction to that in FIG. 5(A).

The carrying device 12 includes none of gear mechanism, timing belts and slide mechanisms, which are essential to the conventional carrying device. Thus, the carrying device 12 is capable of achieving a highly accurate carrying operation and of reducing the production of particles to the least unavoidable extent.

Since the auxiliary arm mechanism 22 that operates in the vertical operating plane intersecting the horizontal operating plane in which the main arm mechanism 20 operates includes the base arm 30 and the arm linkages 32 and 34, an operating space needed by the carrying device 12 for operation has a low height, and the carrying device 12 needs a small operating space so as to be small and compact. The compact carrying device 12 can be rigidly built and increases the degree of freedom of layout.

As obvious from FIG. 5, the pick 14B (14A) moves scarcely when the pick 14A (14B) is moved. Therefore for example, in a state where the pick 14A is not holding any wafer while the pick 14B is holding a wafer, the empty pick 14A can be moved at a high speed because the wafer held by the pick 14B will not slip off the pick 14B.

Second Embodiment

The picks 14A and 14B of the carrying device 12 may be movable in directions forming an angle of about 90° instead of being movable in opposite directions as described in the first embodiment.

A carrying device 12 with such a construction will be described as a second embodiment according to the present invention with reference to FIG. 6, in which parts like or corresponding to those of the carrying device 12 in the first embodiment are denoted by the same reference characters and the description thereof will be omitted.

Figure 6:
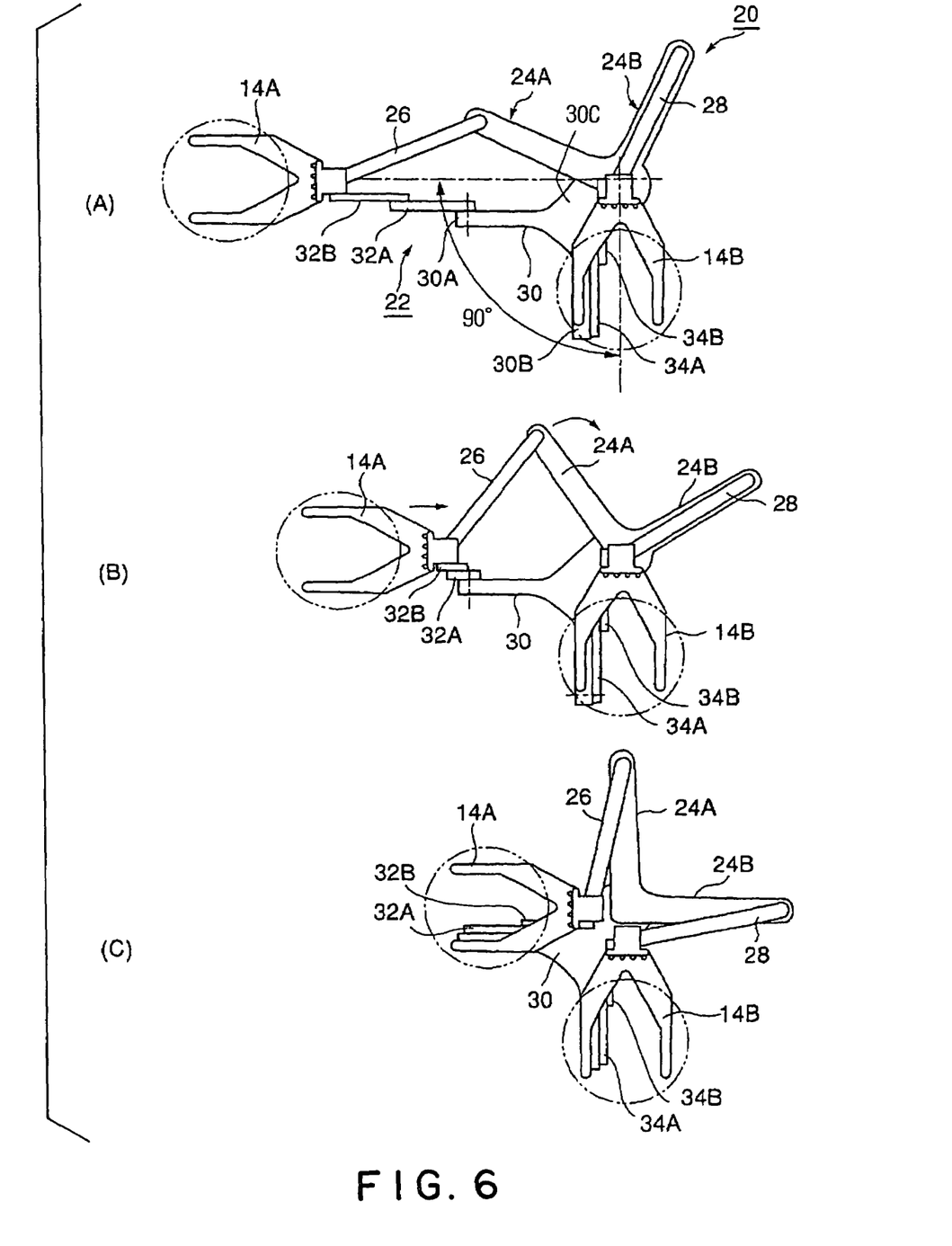
FIG. 6 is a view of assistance in explaining the construction and operation of a carrying device in a second embodiment according to the present invention.

Referring to FIG. 6, a main arm mechanism 20 includes a first main arm 24A and a second main arm 24B extending at an angle of about 90° to the first main arm 24A so that the main arms 24A and 24B are spaced apart from each other. Respective proximal ends of the first arm 26 and the second arm 28 are pivotally connected to a distal end of the first main arm 24A and a distal end of the second main arm 24B, respectively. The first pick 14A and the second pick 14B are connected to the distal ends of the first arm 26 and the second arm 28, respectively.

An auxiliary arm mechanism 22 includes a base arm 30 having a proximal part 30C, a first distal end 30A and a second distal end 30B. The base arm 30 is configured to form an angle of about 90° between the first extending direction from the proximal part 30C toward the first distal end 30A and a second extending direction from the proximal part 30C toward the second distal end 30B. Respective proximal ends of arm linkages 32 and 34 are pivotally connected to the first distal end 30A and the second distal end 30B of the base arm 30, respectively.

The main arm mechanism 20 is turned in the opposite directions to move the picks 14A and 14B forward and backward. The picks 14A and 14B move along straight lines forming an angle of about 90°, respectively.

Third Embodiment

The carrying device 12 in the second embodiment may be built so as to move the picks 14A and 14B along straight lines forming an angle of about 60°.

A carrying device 12 with such a construction will be described as a third embodiment according to the present invention with reference to FIG. 7, in which parts like or corresponding to those of the carrying devices 12 in the first and second embodiment are denoted by the same reference characters and the description thereof will be omitted.

Figure 7:
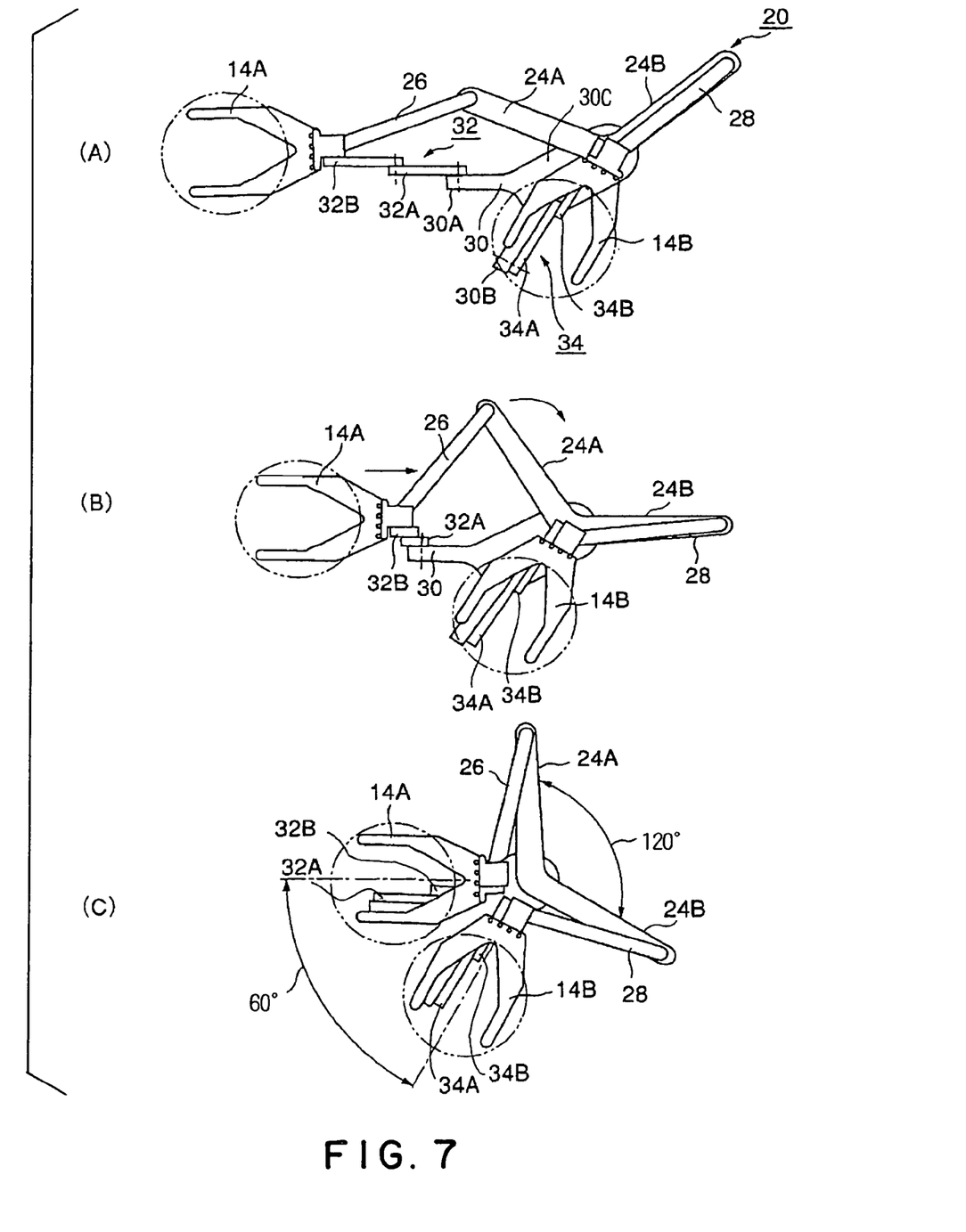
FIG. 7 is a view of assistance in explaining the construction and operation of a carrying device in a third embodiment according to the present invention.

Referring to FIG. 7, a main arm mechanism 20 includes a first main arm 24A and a second main arm 24B extending at an angle of about 120° to the first main arm 24A. Respective proximal ends of the first arm 26 and the second arm 28 are pivotally connected to a distal end of the first main arm 24A and a distal end of the second main arm 24B, respectively. The first pick 14A and the second pick 14B are connected to the distal ends of the first arm 26 and the second arm 28, respectively.

An auxiliary arm mechanism 22 includes a base arm 30 having a proximal part 30C, a first distal end 30A and a second distal end 30B. The base arm 30 is configured to form an angle of about 60° between the first extending direction from the proximal part 30C toward the first distal end 30A and a second extending direction from the proximal part 30C toward the second distal end 30B. Respective proximal ends of arm linkages 32 and 34 are pivotally connected to the first distal end 30A and the second distal end 30B of the base arm 30, respectively.

The main arm mechanism 20 is turned in the opposite directions to move the picks 14A and 14B forward and backward. The picks 14A and 14B move along straight lines forming an angle of about 60°, respectively. The carrying device 12 may be built so as to move the picks 14A and 14B along straight lines forming any suitable angle, unless the wafers held by the picks 14A and 14B interfere with each other.

When the angle between the directions in which the picks 14A and 14B move is as small as about 60°, angle through which the whole carrying device 12 needs to be turned for changing wafers can be reduced to the least extent, operating time can be reduced and thereby throughput can be increased.

Fourth Embodiment

A carrying device 12 in a fourth embodiment according to the present invention will be described with reference to FIG. 8 and FIG. 9, in which parts like or corresponding to those of the carrying device 12 in the first embodiment are denoted by the same reference characters and the description thereof will be omitted.

In each of the carrying devices 12 in the first to the third embodiment, the arm linkages 32 and 34 of the auxiliary arm mechanism 22 have the downward convex V-shape as shown in FIG. 4 and FIG. 5. The carrying device 12 in the fourth embodiment has an auxiliary arm mechanism 22 including arm linkages 32 and 34 having an upward convex V-shape as fully stretched.

Figure 8:
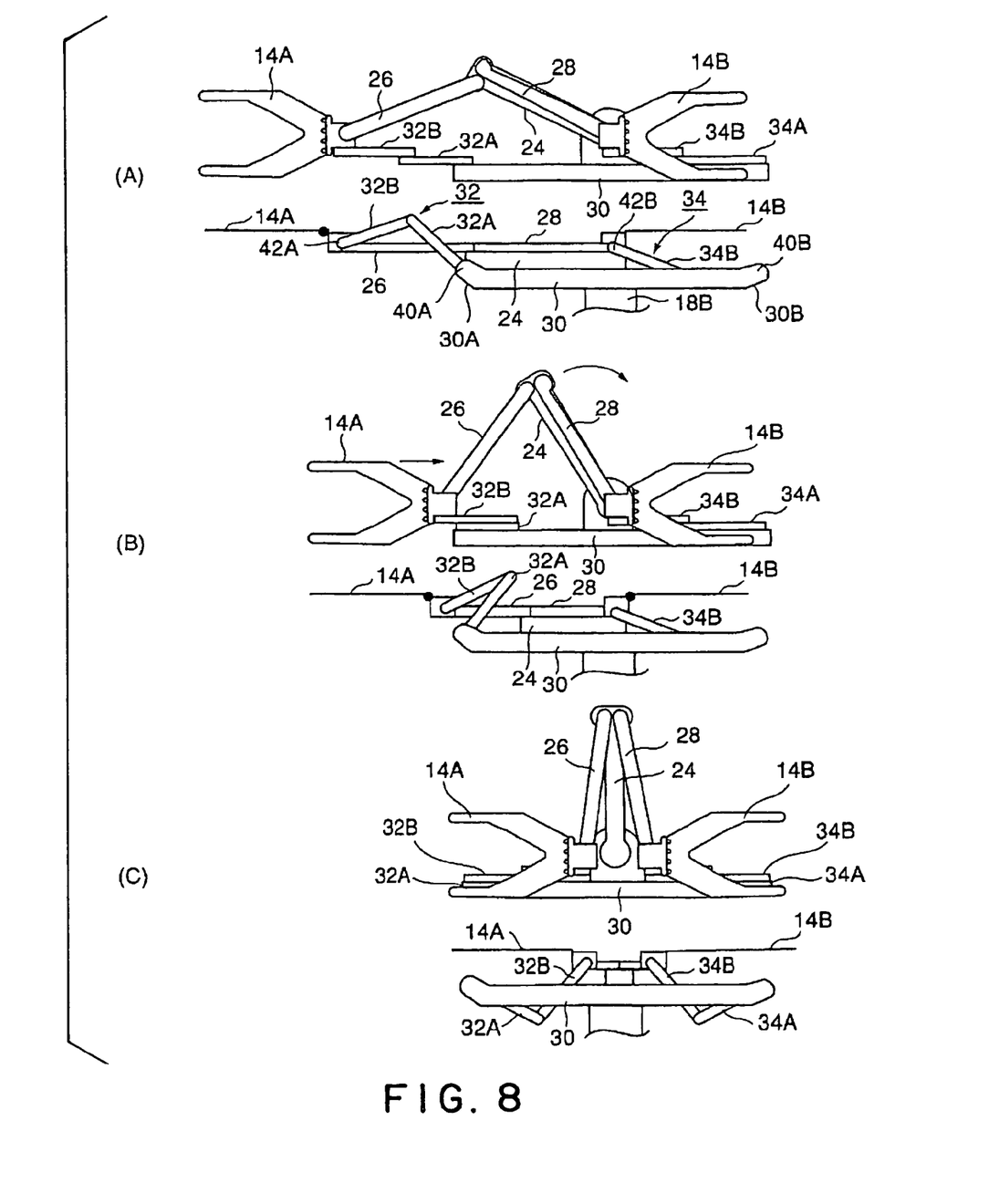
FIG. 8 is a view of assistance in explaining the construction and operation of a carrying device in a fourth embodiment according to the present invention.

Referring to FIG. 8, when the picks 14A and 14B are moved to their forward limit positions, i.e., when the main arm mechanism 20 is fully stretched out, each of the arm linkages 32 and 34 of the auxiliary arm mechanism 22 bends in an upward convex V-shape.

A base arm 30 is disposed such that distal ends 30A and 30B thereof are at a low height and that joints 40A and 40B between the distal ends 30A and 30B thereof and the proximal ends of the arm linkages 32 and 34 are at a height lower than that of joints 42A and 42B between the distal ends of the arm linkages 32 and 34 and the picks 14A and 14B, for example, about 30 mm. Thus, it is possible to avoid forming a dead point in which the auxiliary arms 32A and 32B overlap each other and a dead point in which the auxiliary arms 34A and 34B overlap each other.

Figure 9:
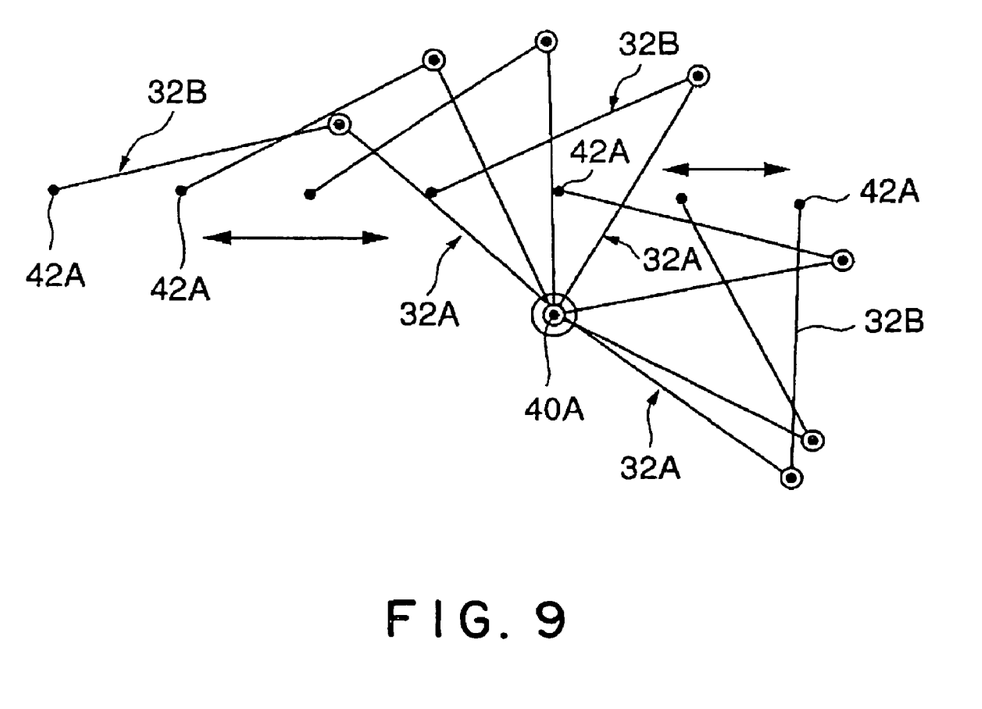
FIG. 9 is a diagrammatic view typically illustrating the motion of an arm linkage included in the carrying device in the fourth embodiment.

As obvious from FIG. 9 showing the motion of the arm linkage 32 wherein the auxiliary arms 32A and 32B never overlap each other even when the pick 14A is moved through a maximum stroke. Since the auxiliary arms 32A and 32B of the arm linkage 32 never overlap each other, and the auxiliary arms 34A and 34B forming the arm linkage 34 never overlap each other when the main arm mechanism bends and stretches, the arm linkages 32 and 34 do not have any dead point and hence the picks 14A and 14B can be prevented from vertical shaking.

Fifth Embodiment

Figure 10:
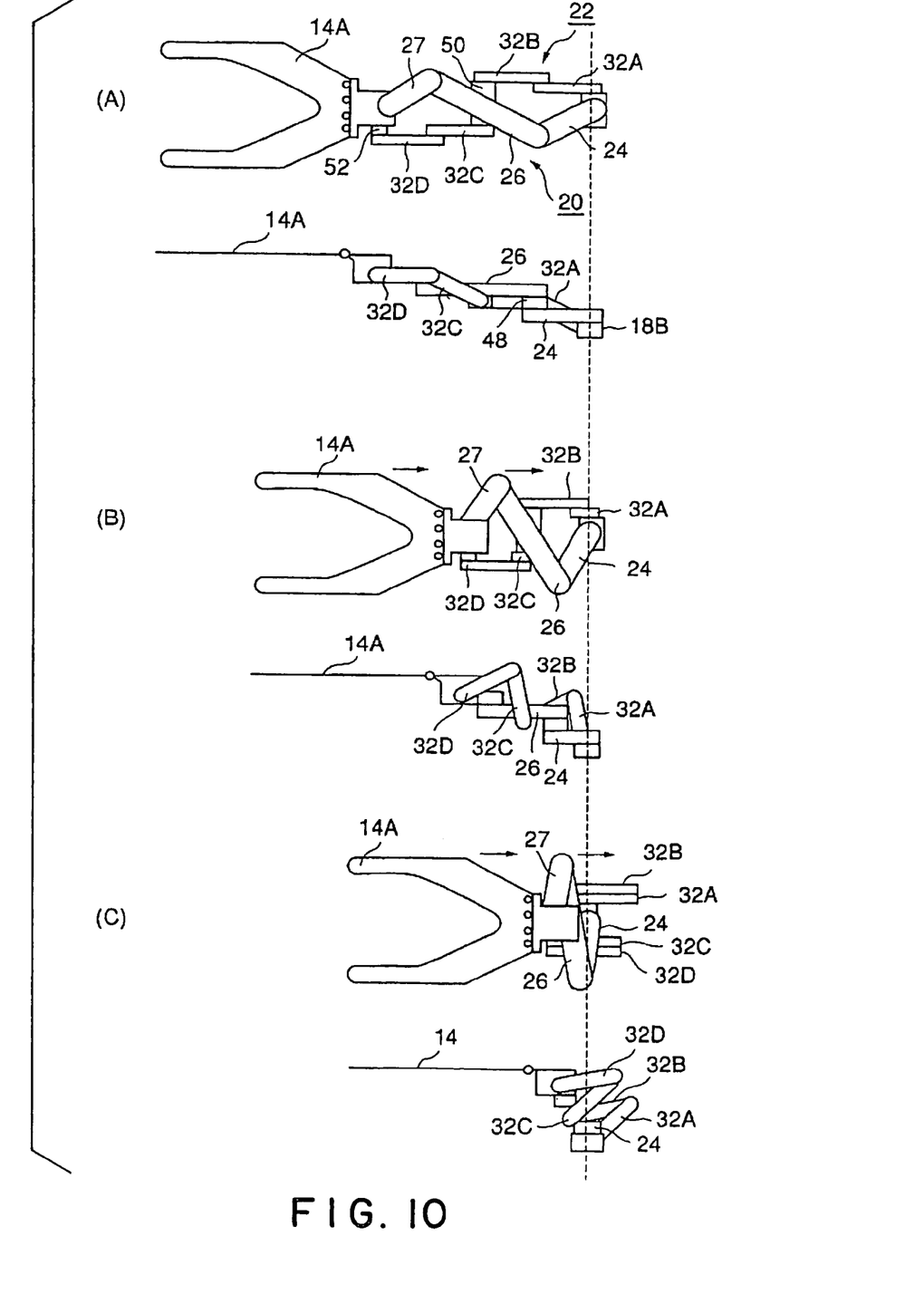
FIG. 10 is a view of assistance in explaining the construction and operation of a carrying device in a fifth embodiment according to the present invention.
Figure 11:
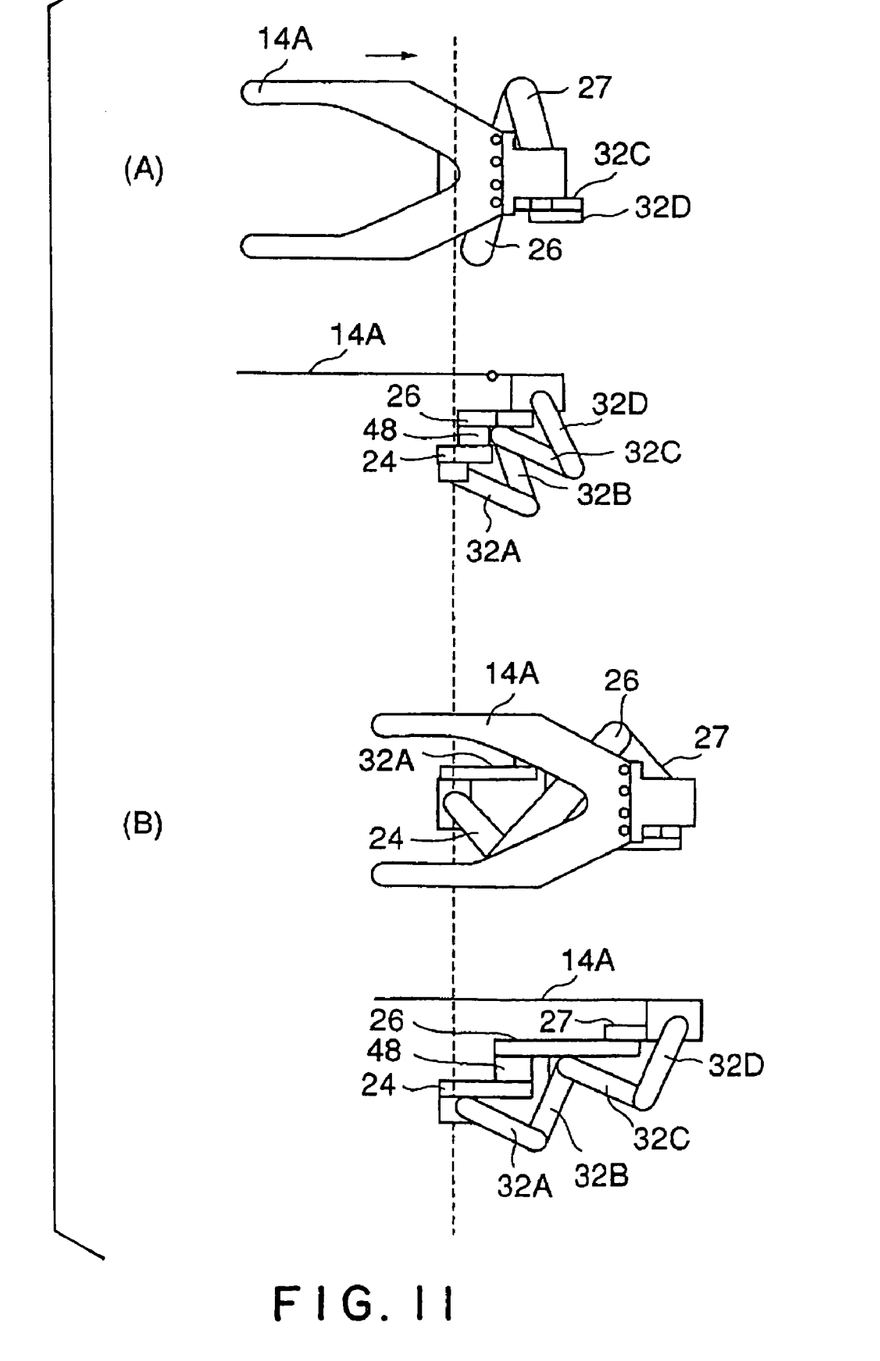
FIG. 11 is a view of assistance in explaining the construction and operation of the carrying device in the fifth embodiment.

A carrying device 12 in a fifth embodiment according to the present invention will be described with reference to FIG. 10 and FIG. 11, in which parts like or corresponding to those of the carrying devices 12 in the foregoing embodiments are denoted by the same reference characters and the description thereof will be omitted In each of the carrying devices in the first to the fourth embodiment, the main arm mechanism 20 has two arms for one pick, i.e., the main arm 24 and the first arm 26 for the pick 14A, and the main arm 24 and the second arm 28 for the pick 14B as shown in FIG. 3. The carrying device in the fifth embodiment has a main arm mechanism 20 including three main arms 24, 26 and 27 for one pick, and an auxiliary arm mechanism 22 including four auxiliary arms 32A, 23B, 32C and 32D for one pick as shown in FIG. 10 and FIG. 11. The auxiliary arm mechanism 22 does not necessarily include any member corresponding to the base arm 30 shown in FIG. 4. The carrying device in the fifth embodiment will be described on an assumption that the auxiliary arm mechanism 22 does not include any member corresponding to the base arm 30, and the carrying device is provided with only one pick 14A to facilitate understanding.

Referring to FIG. 10 and FIG. 11, a main arm mechanism 20 includes three main arms, namely, a first proximal main arm 24, a second intermediate main arm 26 and a third distal main arm 27. The second main arm 26 has a proximal end and a distal end pivotally connected to a distal end of the first main arm 24 and a proximal end of the third main arm 27, i.e., the distal and proximal ends of the adjacent main arms 24 and 27, respectively. A joint connecting the first main arm 24 and the second main arm 26 is provided with a spacer 48. The main arm mechanism 20 operates in a horizontal operating plane.

The first main arm 24 and the third main arm 27 are of almost the same length, and the length of the second main arm 26 is approximately twice the length of the first main arm 24 and the third main arm 27. A proximal end of a pick 14A is pivotally connected to the distal end of the third main arm 27 such that the pick 14A is able to turn in a horizontal plane.

The auxiliary arm mechanism 22 includes four auxiliary arms, namely, a first proximal auxiliary arm 32A, a second intermediate auxiliary arm 32B, a third intermediate auxiliary arm 32C and a fourth distal auxiliary arm 32D. A proximal end of the second auxiliary arm 32B and a distal end of the third auxiliary arm 32C are connected pivotally to a distal end of the first auxiliary arm 32A and a proximal end of the fourth auxiliary arm 32D, i.e., the ends of the adjacent auxiliary arms 32A and 32D, respectively. A distal end of the second auxiliary arm 32B and a proximal end of the third auxiliary arm 32C are connected pivotally to the ends of the adjacent auxiliary arms 32C and 32B, respectively. That is, the distal end of the second auxiliary arm 32B and the proximal end of the third auxiliary arm 32C are connected pivotally to each other. The auxiliary arm mechanism 22 operates in a vertical operating plane.

Each pair of adjacent auxiliary arms is combined to form a single arm set. The first auxiliary arm 32A and the second auxiliary arm 32B is combined to form a first arm set, and the third auxiliary arm 32C and the fourth auxiliary arm 32D are combined to form a second arm set. The first and second arm sets are connected through a connecting plate 50.

The connecting plate 50 has one longitudinal end to which the distal end of the second auxiliary arm 32B is connected for turning in a vertical plane, and the other longitudinal end to which the proximal end of the third auxiliary arm 32C is connected for turning in a vertical plane. The connecting plate 50 has a middle part pivotally connected to a middle part of the second main arm 26. The connecting plate 50 turns in a horizontal plane. A proximal end of the first auxiliary arm 32A is connected for turning in a vertical plane to the side surfaces of the outer shaft 18B (FIG. 2). A distal end of the fourth auxiliary arm 32D is connected for turning in a vertical plane to the side surface of a proximal end of the pick 14A with a spacer 52 interposed between the fourth auxiliary arm 32d and the pick 14A.

The first arm set of the first auxiliary arm 32A and the second auxiliary arm 32B, and the second arm set of the third auxiliary arm 32C and the fourth auxiliary arm 32D are disposed on the right and the left side of the main arm mechanism 20, respectively. When the carrying device contracts to retract the pick 14A as shown in FIG. 10(B), the auxiliary arms 32A, 32B, 32C and 32D do not interfere with each other.

The inner shaft 18A (FIG. 2) is turned in the opposite directions to move the pick 14A forward and backward to carry a wafer held by the pick 14A as shown in FIG. 10 and FIG. 11. Since the carrying device does not include none of gear mechanisms and timing belts, the carrying device has the same effects as those of the first to the fourth embodiment and is capable of achieving a highly accurate carrying operation and of reducing the production of particles to the least unavoidable extent.

The main arm mechanism 20 and the auxiliary arm mechanism 22 of the carrying device in the fifth embodiment include more arms than those of the carrying devices in the first to the fourth embodiment. Therefore, the main arm mechanism 20 and the auxiliary arm mechanism 22 can be very compactly folded and hence the carrying device in the fifth embodiment needs a operating space smaller than those needed by the carrying devices in the first to the fourth embodiment.

The main arm mechanism 20 may include more than three main arms, and the auxiliary arm mechanism 22 may include more than four auxiliary arms. The number of the intermediate auxiliary arms between a first auxiliary arm and a last auxiliary arm at the base end and the distal end, respectively, of the auxiliary arm mechanism 22 is twice that of the intermediate main arms between a first main arm and a last main arm at the base end and the distal end, respectively, of the main arm mechanism 20, and arm sets each of the two auxiliary arms are disposed alternately on the right and the left side of the main arm mechanism 20.

The main arm mechanism 20 may include n main arms (n is an integer not smaller than three), and the auxiliary arm mechanism may include 2(n−1) auxiliary arms.

Although the carrying devices in the first to the fourth embodiment have been described on an assumption that each of the carrying devices is provided with the two picks 14A and 14B, the carrying devices may be provided with a single pick, and only mechanisms for operating the single pick.

Although the auxiliary arm mechanisms 22 of the carrying devices in the first to the fifth embodiment operate in a vertical operating plane, the same may operate in an oblique operating plane intersecting a horizontal plane at an optional angle.

In the carrying devices in the first to the fifth embodiment the proximal end of the main arm mechanism 20 and that of the auxiliary arm mechanism 22 are connected to the inner shaft 18A and the outer shaft 18B, respectively, the inner shaft 18A and the outer shaft 18B coaxially combined with the inner shaft 18A are turned simultaneously to swivel the carrying device 12, and only the inner shaft 18A is turned to move the picks 14A and 14B. A carrying device according to the present invention may include a turntable, an auxiliary arm mechanism having a proximal end connected to the turntable, a shaft supported for turning on the turntable, and a main arm mechanism having a proximal end connected to the shaft.

The carrying devices in the first to the fifth embodiment are supposed to operate in a vacuum space, and the inner shaft 18A to which the proximal end of the main arm mechanism 20 is connected is turned to move the picks 14A and 14B. A drive mechanism for turning the first auxiliary arm 32A in a vertical plane may be built into the joint between the base arm 30 of the auxiliary arm mechanism 22 and the first auxiliary arm 32A of the arm linkage 32 to move the picks 14A and 14B. In the carrying device in the fifth embodiment, a rotative drive mechanism may be built into the joint between the base arm 30 and the first auxiliary arm 32A. The carrying device 12 does not need necessarily to be able to turn.

The carrying device 12 does not need necessarily to be installed only in the transfer chamber 6 (FIG. 1) and may be installed in any suitable place, such as a place in the atmosphere.

The present invention is not limited in its practical application to the carrying device for carrying wafers, and is applicable to carrying devices for carrying glass substrates and LCD panels.

What is claimed is:

1. A carrying device for carrying an object to be processed above a base, said carrying device comprising:
   (a) a pick for holding the object, the pick moving only in a first operating plane;
   (b) a main arm mechanism having a proximal end supported by the base and a distal end connected to the pick, the main mechanism comprising at least two arms pivotally connected to each other so as to bend and stretch only in the first operating plane; and
   (c) an auxiliary arm mechanism including:
      (c1) a base arm having a proximal end supported by the base, and a distal end, and
      (c2) an arm linkage having a proximal end connected to the distal end of the base arm and a distal end connected to the pick, the arm linkage comprising at least two arms pivotally connected to each other so as to bend and stretch only in a second operating plane intersecting the first operating plane.

2. The carrying device according to claim 1, further comprising first and second drive shafts coaxially supported by the base for individual rotation, and
the proximal end of the main arm mechanism and the proximal end of the base arm are connected to the first and second drive shafts, respectively.

3. The carrying device according to claim 1, wherein the first operating plane in which the main arm mechanism operates is a horizontal plane, and the second operating plane in which the auxiliary arm mechanism operates is a vertical plane.

4. The carrying device according to claim 3, wherein a joint between the base arm and the arm linkage of the auxiliary arm mechanism is at a level lower than that of a joint between the arm linkage and the pick.

5. The carrying device according to claim 3, wherein the arm linkage of the auxiliary arm mechanism is bendable in a V-shape in the vertical plane.

6. A carrying device for carrying an object to be processed above a base, said carrying device comprising:
(a) first and second picks each for holding the object;
(b) a main arm mechanism adapted to bend and stretch in a first operating plane, and including:
  (b1) a main arm having a proximal end supported by the base and a distal end,
  (b2) a first arm having a proximal end connected to the distal end of the main arm and a distal end connected to the first pick, and
  (b3) a second arm having a proximal end connected to the distal end of the main arm and a distal end connected to the second pick; and
(c) an auxiliary arm mechanism including:
  (c1) a base arm having a proximal part supported by the base, and having first and second distal ends,
  (c2) a first arm linkage having a proximal end connected to the first distal end of the base arm and a distal end connected to the first pick, the first arm linkage comprising at least two arms pivotally connected to each other so as to bend and stretch in a second operating plane intersecting the first operating plane, and
  (c3) a second arm linkage having a proximal end connected to the second distal end of the base arm and a distal end connected to the second pick, the second arm linkage comprising at least two arms pivotally connected to each other so as to bend and stretch in a third operating plane intersecting the first operating plane.

7. The carrying device according to claim 6, wherein the base arm is configured to form a straight angle between a first extending direction from the proximal part toward the first distal end of the base arm, and a second extending direction from the proximal part toward the second distal end of the base arm, and
the first and second picks are moved in parallel to the first and second extending directions, respectively.

8. The carrying device according to claim 6, wherein the first operating plane in which the main arm mechanism operates is a horizontal plane, and the second and third operating planes in which the auxiliary arm mechanism operates are vertical planes.

9. A carrying device for carrying an object to be processed above a base, said carrying device comprising:
(a) first and second picks each for holding the object;
(b) a main arm mechanism adapted to bend and stretch in a first operating plane, and including:
  (b1) a main arm having a proximal end supported by the base, and first and second distal ends spaced from each other,
  (b2) a first arm having a proximal end connected to the first distal end of the main arm and a distal end connected to the first pick, and
  (b3) a second arm having a proximal end connected to the second distal end of the main arm and a distal end connected to the second pick; and
(c) an auxiliary arm mechanism including:
  (c1) a base arm having a proximal part supported by the base, and first and second distal ends,
  (c2) a first arm linkage having a proximal end connected to the first distal end of the base arm and a distal end connected to the first pick, the first arm linkage comprising at least two arms pivotally connected to each other so as to bend and stretch in a second operating plane intersecting the first operating plane, and
  (c3) a second arm linkage having a proximal end connected to the second distal end of the base arm and a distal end connected to the second pick, the second arm linkage comprising at least two arms pivotally connected to each other so as to bend and stretch in a third operating plane intersecting the first operating plane,
wherein the base arm is configured to form an angle of less than 180° between a first extending direction from the proximal part toward the first distal end of the base arm, and a second extending direction from the proximal part toward the second distal end of the base arm, and
the first and second picks are moved in parallel to the first and second extending directions, respectively.

* * * * *